United States Patent [19]

Cricchi

[11] Patent Number: 4,513,309
[45] Date of Patent: Apr. 23, 1985

[54] PREVENTION OF LATCH-UP IN CMOS INTEGRATED CIRCUITS USING SCHOTTKY DIODES

[75] Inventor: James R. Cricchi, Catonsville, Md.

[73] Assignee: Westinghouse Electric Corp., Pittsburgh, Pa.

[21] Appl. No.: 438,835

[22] Filed: Nov. 3, 1982

[51] Int. Cl.³ .............................................. H01L 27/02
[52] U.S. Cl. ...................................... 357/42; 357/15; 357/41; 357/86
[58] Field of Search ....................... 357/42, 15, 41, 86; 307/200 A, 304, 317 A

[56] References Cited

U.S. PATENT DOCUMENTS

| | | | |
|---|---|---|---|
| 4,152,717 | 5/1979 | Saton | 357/86 |
| 4,300,152 | 11/1981 | Lepselter | 357/42 |
| 4,327,368 | 4/1982 | Uchida | 357/86 |

Primary Examiner—Martin H. Edlow
Attorney, Agent, or Firm—W. G. Sutcliff

[57] ABSTRACT

A complementary metal oxide semiconductor (CMOS) circuit is described incorporating Schottky barrier diodes in parallel with the source or drain of either the P or N channel transistors to reduce the minority current injected into the body at times the source or drain of either the N or P channel transistors are forward biased. The Schottky diode may be fabricated by making enlarged openings exposing both the body (substrate) and drain or source region and by using a metallization which may form an ohmic contact with the drain or source region and at the same time for a Schottky diode with the substrate. By incorporating Schottky barrier diodes parallel to the drain or source the P and N-type transistors are not current limited by the barrier height of only a Schottky diode acting as the source and at the same time minority current is not injected into the substrate or body at times the drain or source is forward biased. An input and output protection network is also described incorporating Schottky diodes.

18 Claims, 13 Drawing Figures

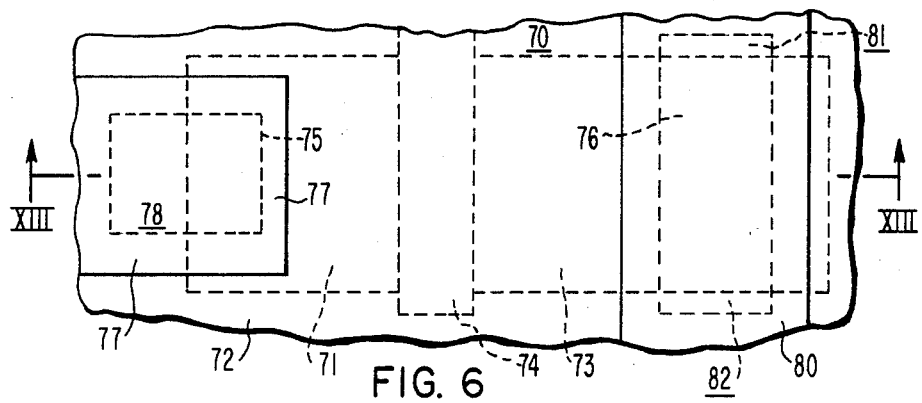
FIG. 6
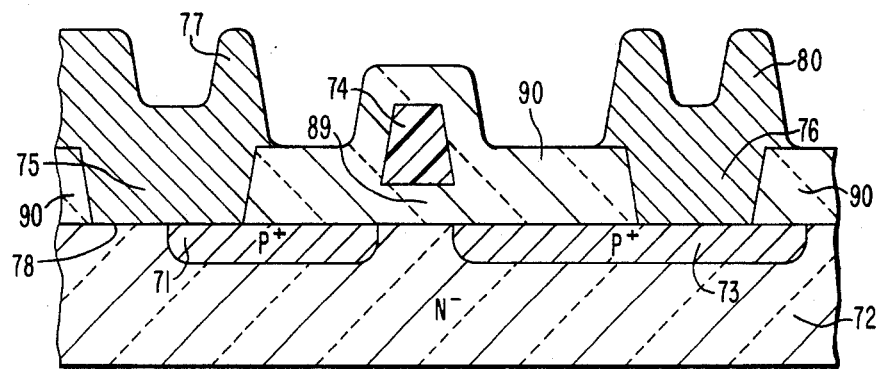
FIG. 13
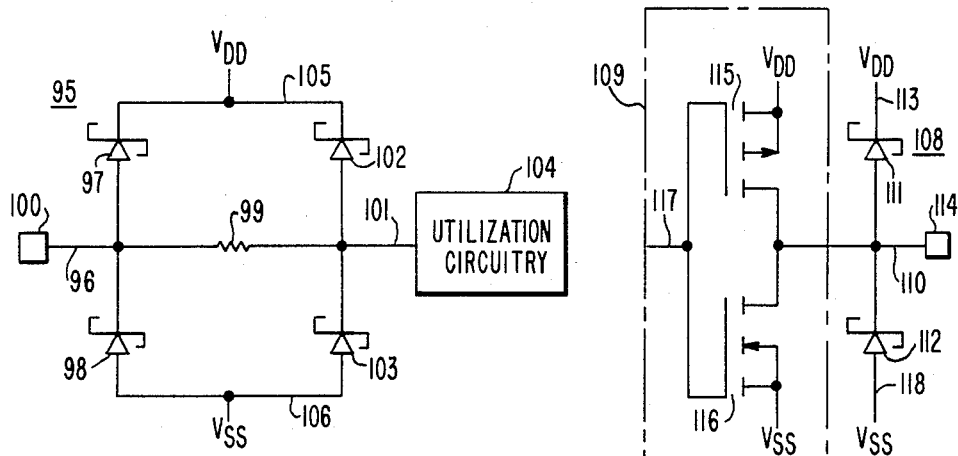
FIG. 9
FIG. 10

PREVENTION OF LATCH-UP IN CMOS INTEGRATED CIRCUITS USING SCHOTTKY DIODES

BACKGROUND OF THE INVENTION

1. Field of the Invention

This invention relates to eliminating the latch-up effect in integrated circuits and particularly to the use of Schottky barrier diodes to prevent latch-up in parasitic PNPN structures causing such as in CMOS integrated circuits.

2. Description of the Prior Art

In complementary metal oxide silicon (CMOS) integrated circuits fabricated in bulk silicon, a PNPN structure exists. When an external noise pulse, signal overshoot transient or transient radiation pulse occurs, current may forward bias one of the PN junctions. The PNPN structure or four-layer structure may be switched into a low impedance state called latch-up. The four-layer structure may be viewed as a PNP bipolar transistor coupled to an NPN transistor where the base of the PNP transistor is coupled to and forms a collector of the NPN transistor, and the emitter of the PNP transistor is coupled to and forms a base of the NPN transistor. Conditions for latch-up exist in the four-layer structure when the current gain $\beta$ of the PNP transistor multiplied by the $\beta$ of the NPN transistor is greater than one.

Latch-up is a serious problem in CMOS integrated circuits because N and P channel transistors are located close to one another. in very high speed integrated (VHSI) devices, the spacing between N and P channel transistors is very small. Typically, a substrate of N material or a layer of N-type material has P-type MOS field effect transistors formed therein. A P-type region or P tub is formed in the N-type substrate or N-type layer. N-type transistors are formed in the P region or P tub. A four-layer structure is formed including the drain or source of the P-type transistor, the N-type substrate, the P tub and the drain or source of the N-type transistor. Additional PN junctions are formed when the gate input is protected from overvoltage by a protective diode formed in the P tub or in the substrate.

In U.S. Pat. No. 4,300,152, which issued on Nov. 10, 1981 to Martin P. Lepselter, a complementary field effect transistor integrated circuit was shown in FIG. 4 where in place of a P-channel MOS transistor, a Schottky barrier insulated gate field effect transistor was used. The Schottky barrier insulated gate field effect transistor provided a source and drain which when forward biased with respect to the N substrate was incapable of injecting minority carriers (electron vacancies or holes) into the N-type substrate. Without minority carrier injection no transistor action occurs. In effect, the four-layer structure is reduced to a three-layer structure NPN with the last N being the substrate material. The drain and source of the Schottky barrier insulated gate field effect transistor (IGFET) does not act as a P-type region even though the resulting field effect transistor is P-type.

One example of an insulated gate field effect transistor using Schottky barrier contacts is described in a publication entitled "SB-IGFET: An Insulated-Gate Field Effect Transistor Using Schottky Barrier Contacts For Source And Drain", Proceedings of IEEE, Vol. 56, August 1968, pp. 1400–1402, by M. P. Lepselter and S. M. Sze.

When using a Schottky barrier IGFET in a CMOS circuit such as, for example, for the P-channel transistor, the source is reverse-biased which interferes with the drain source conduction when the transistor is turned on or attempted to be turned on. The Schottky barrier height is an impediment to current flow across the channel region, and even when current flows it is limited due to the barrier height. In addition, due to the high fields generated by the barrier height, the Schottky barrier junction near the surface at both the drain and source may experience high leakage currents, such as for example with a platinum silicide-silicon junction.

It is therefore desirable to provide a field effect transistor which does not inject minority carriers into the substrate when forward biased at its drain or source and at the same time does not limit the current passing between the drain and source due to the barrier height of a Schottky barrier.

It is further desirable to reduce leakage currents due to a Schottky barrier diode incorporated in a field effect transistor as its source or drain.

It is further desirable to provide a CMOS circuit which may be fabricated in bulk silicon that incorporates Schottky barrier diodes in parallel to the source or drain to reduce latch-up while having field effect transistors with high drain to source conduction at low currents.

It is further desirable to provide input and output networks using Schottky diodes to minimize minority current injection at time the diodes are forward biased.

SUMMARY OF THE INVENTION

In accordance with the present invention, a complementary MOS circuit fabricated in bulk silicon is less susceptible to latch-up by coupling at least one Schottky barrier diode across the source to body or drain to body junction of a field effect transistor in parallel to attenuate the injection of minority carriers into the body at times the drain or source is forward biased with respect to the body.

The invention further provides input and output networks for interfacing with off chip signal interconnections that may be exposed to static electricity and signal overvoltage conditions incorporating Schottky barrier diodes to minimize minority current injection at times the diodes are forward biased.

BRIEF DESCRIPTION OF THE DRAWING

FIG. 6 is an alternate embodiment of the invention.

FIG. 9 is a schematic circuit of an alternate embodiment of the invention.

FIG. 10 is a schematic circuit of an alternate embodiment of the invention.

FIG. 13 is a cross section view along the lines XIII—XIII of FIG. 6.

DESCRIPTION OF THE PREFERRED EMBODIMENT

Figure 1:
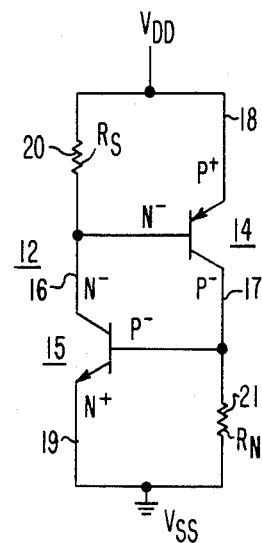
FIG. 1 is a schematic diagram of the SCR circuit formed by a PNPN structure.

Referring to the drawing and in particular to FIG. 1, a schematic diagram of the silicon controlled rectifier (SCR) circuit is shown formed by a PNPN structure. The four-layer structure is formed by the PNP bipolar transistor 14 and the NPN bipolar transistor 15 where the base of the PNP transistor 14 is in common with the collector of the NPN transistor 15 shown by line 16. The collector of PNP transistor 14 is in common with the base of NPN transistor 15 shown by line 17. The emitter of transistor 14 is coupled over line 18 to voltage, $V_{DD}$. The emitter of transistor 15 is coupled over line 19 to voltage, $V_{SS}$ which may be, for example, ground potential. Resistor 20 is coupled between line 16 and line 18 and represents the series resistance of the N layer or N region to $V_{DD}$. Resistor 21 is coupled between line 17 and line 19 and represents the resistance of the P layer or P region to voltage potential $V_{SS}$.

Figure 2:
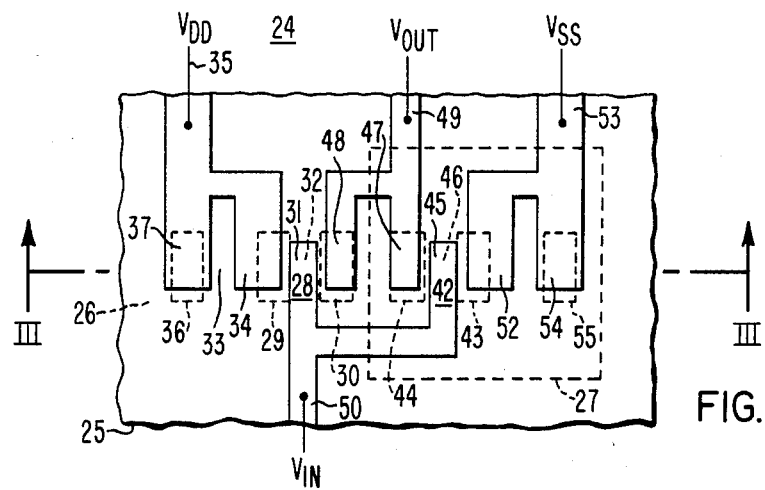
FIG. 2 is a plan view of one embodiment of the invention.
Figure 3:
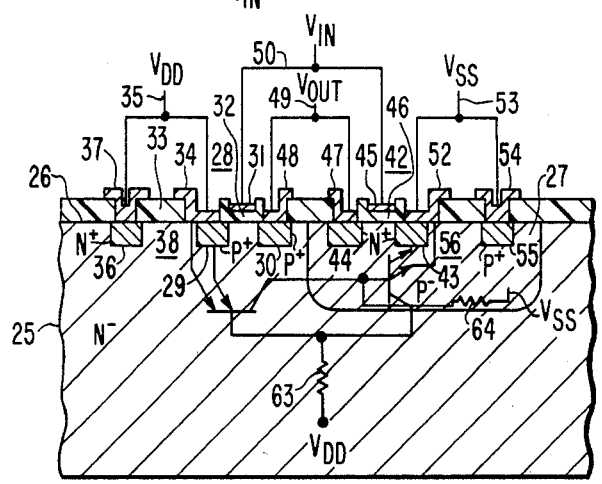
FIG. 3 is a cross-section view along the lines III—III of FIG. 2.

FIG. 2 is a plan view of a CMOS inverter 24. FIG. 3 is a cross-section view along the lines III—III of FIG. 2. Substrate 25 is of $N^-$ type semiconductor material such as silicon or gallium arsenide having an upper surface 26. In upper surface 26 is $P^-$ region 27. A P channel field effect transistor 28 is formed in upper surface 26 of substrate 25 having a source formed by $P+$ region 29 and a drain formed by $P+$ region 30. A conductive gate electrode 31 is formed over a gate dielectric 32 between regions 29 and 30. An opening in field dielectric or oxide 33 permits aluminum metallization 34 to be in contact with $P+$ region 29 and substrate 25. Metallization 34 is in ohmic contact with $P+$ region 29 and forms a Schottky barrier diode with substrate 25. Metallization 34 is coupled over line 35 to voltage $V_{DD}$. An $N+$ region 36 is formed in the upper surface 26 of substrate 25. Metallization 37 which may for example be aluminum is in ohmic contact with region 36 and is coupled to voltage $V_{DD}$ over line 35 to place substrate 25 at the potential of $V_{DD}$.

An N-channel field effect transistor 42 is formed in the upper surface 26 of $P^-$ region 27 by $N+$ region 43 acting as the source and $N+$ region 44 acting as the drain. A gate electrode 45 is formed over gate dielectric 46 between regions 43 and 44. Metallization 47 makes ohmic contact with region 44 through an opening in field oxide 33. Metallization 48 makes ohmic contact with region 30 through an opening in field dielectric 33 and is coupled to metallization 47 over line 49. Line 49 functions as an output terminal $V_{OUT}$ of CMOS inverter 24. Gate electrode 31 is coupled over line 50 to gate electrode 45. Line 50 functions as an input, $V_{IN}$ for CMOS inverter 24. Metallization 52 such as platinum is in contact with $N+$ region 43 and the upper surface 26 of region 27 by means of an enlarged opening through field dielectric 33. Metallization 52 forms a Schottky barrier diode with region 27. For example, platinum may be sintered to form platinum silicide titanium or tungsten 200 Angstrom thick may be deposited over the platinum silicide followed by depositing a conductive material such as aluminum. The Schottky diode is formed with the P type regions 27 being the anode and the platinum silicide the cathode. Metallization 52 is coupled over line 53 to metallization 54 and to voltage $V_{SS}$. Metallization 54 is in ohmic contact with $P+$ region 55 which is formed within region 27 through surface 26. $P+$ region 55 functions to hold region 27 at the voltage $V_{SS}$.

The Schottky diode 56 formed at the source of transistor 42 may also be formed at the drain in like manner. Schottky diode 38 formed at the source of transistor 28 may also be formed at the drain in like manner by having metallization 48 such as aluminum overlap $P+$ region 30 and upper surface 26 of substrate 25.

As shown in FIGS. 2 and 3 a CMOS inverter circuit is formed by a P channel transistor coupled in series with an N-channel transistor between voltage $V_{DD}$ and $V_{SS}$. In addition, due to the presence of numerous N and P regions, a four-layer PNPN structure exists which results in an SCR circuit being formed shown in FIG. 4. The circuit of FIG. 4 is also overlayed in FIG. 3 to clearly point out the P and N regions involved in a typical parasitic circuit.

While FIGS. 2 and 3 show a $P^-$ well 27 in $N^-$ substrate 25 locating N channel transistor 42, a $P^-$ substrate could be used for locating N channel transistor 42 and an $N^-$ well could be formed for locating P channel transistor 28. The $N^-$ well in a $P^-$ substrate is more convenient when fabricating input and output protection networks with CMOS circuitry using Schottky diodes as shown by the $N^-$ regions 124 and 125 in P substrate 122 in FIGS. 11 and 12.

The semiconductor substrate material may be selected from the group Ge, Si, InSb, GaAs, InP, CdTe, GaP, GaTe, CdSe, SiC, ZnSe, GaSe, CdS, GaS and ZnS. If substrate 25 is silicon a metal silicide-silicon junction may form the Schottky diode where the metal may be selected from the groups Au, Pe, Pd, Rh, Ni, Co, W, Ti, Zr, Ta, Cr and Mo.

Figure 4:
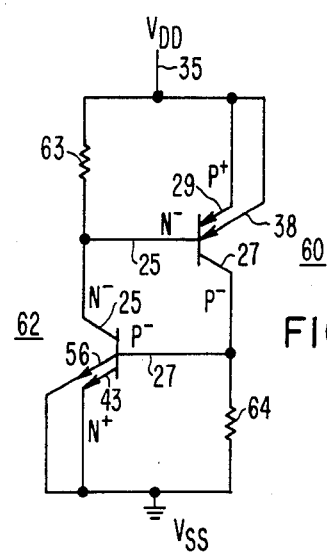
FIG. 4 is a schematic diagram of the parasitic circuitry of FIG. 2.

Referring to FIG. 4 PNP transistor 60 has an emitter formed by region 29, a base formed by region 25 and a collector formed by $P^-$ region 27. In addition to region 29 a Schottky diode 38 is coupled in shunt with region 29. NPN transistor 62 has an emitter formed by region 43, a base formed by region $P^-$ 27 and a collector formed by substrate 25. In addition, à Schottky diode 56 is coupled in shunt with source region 43. Resistor 63 represents the resistance of substrate 25 to voltage $V_{DD}$. The resistor 64 represents the resistance of region 27 to voltage potential $V_{SS}$.

Schottky diode 38 is in parallel with the source of transistor 28 and greatly limits the injection of minority carriers, electron vacancies or holes in the substrate 25. Schottky barrier 56 in parallel with source 43 greatly limits the injection of minority carriers electrons into $P^-$ region 27. In addition, Schottky barrier diodes may be placed in parallel with the drain of transistors 28 and 42. The effective beta or current gain of the parasitic transistors 60 and 62 shown in FIG. 4 is greatly reduced and the transient current required to induce latch-up is greatly increased.

Figure 5:
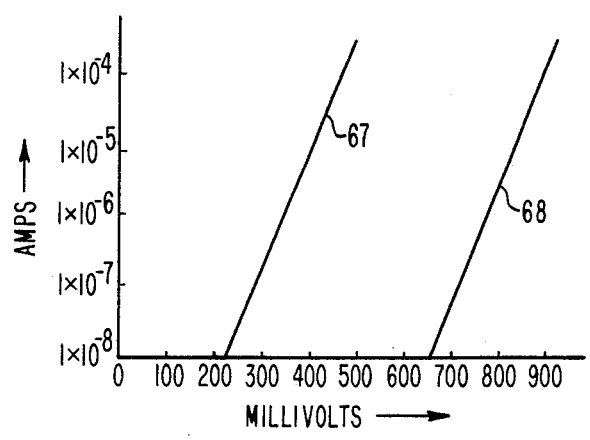
FIG. 5 is a graph of the current as a function of forward voltage drop of a Schottky barrier diode and of a PN junction diode.

The transport mechanism in silicon Schottky barrier diodes at low fields is due to thermionic emission of majority carriers. The ratio of holes to electrons is typically 0.1% at low fields and room temperature and only goes to 5% at high current density such as 350 amps per $cm^2$. The use of Schottky diodes greatly reduces the chance of latch-up since when these devices are forward-biased, very little minority carrier current flows. This of course is not truefor normal P-N junction diodes on silicon where a great deal of minority carrier current flows under forward-biased conditions, leading to bipolar parasitic transistor action and latch-up. A comparison of a Schottky diode to a PN junction diode is shown in FIG. 5. In FIG. 5 the ordinate represents forward-biased current and the abscissa represents forward voltage $V_F$. Curve 67 represents the minority carrier current as a function of forward voltage, $V_F$. The ratio of minority current, holes, to electron current in N-type material is provided by equation 1.

$$\gamma = \frac{J_p}{J_N} = \frac{N_i^2}{N_D^2} \cdot \frac{\mu_p}{\mu_n} \cdot \frac{J}{J_S} \tag{1}$$

The term $J_S$ is Equation 1 is the pre-exponential Schottky coefficient given in Equation 2.

$$J_S = A^{**} T^2 \mathrm{EXP} \frac{-q\phi_{BN}}{KT} \tag{2}$$

As shown by Equation 1, the minority carrier injection can be minimized by using a larger background doping density $N_D$ and with small barrier height. Curve 68 in FIG. 5 shows the minority current vs. voltage for a PN junction diode. Since a Schottky diode such as 56 in a PN junction such as region 43 and region 47 are coupled in parallel, then the forward drop across the PN junction and Schottky diode are the same. By indentifying the forward voltage in FIG. 5 the current through each diode may be determined. The current through the Schottky diode is several orders of magnitude greater than the current through the PN junction.

FIG. 6 shows transistor 70 having a drain 71 formed by a P+ region in a substrate 72 of N-type material. A source 73 is formed by a P+ region in substrate 72. A gate electrode 74 which may be aluminum or polysilicon material is separated from substrate 72 by gate dielectric 89. A cross section view along the lines XIII—XIII is shown in FIG. 13. A field dielectric 90 covers substrate 72 except for openings 75 and 76. Metallization 77 which may for example be aluminum fills opening 75 and provides a Schottky barrier diode 78 in parallel with the diode formed by region 71 and substrate 72. Metallization 77 also makes ohmic contact with region 71. Metallization 80 fills opening 76 and forms Schottky barrier diodes 81 and 82 on either side of P+ region 73. Metallization 80 also makes ohmic contact with metallization 73. Schottky barrier diodes 81 and 82 are in parallel with the diode formed by P+ region 73 and substrate 72. Metallizations 77 and 80 may for example be aluminum and substrate 72 may for example be N− silicon.

Figure 7:
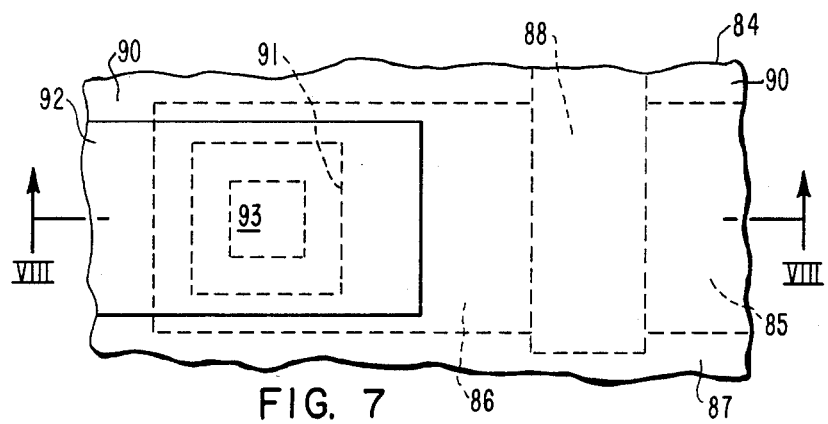
FIG. 7 is an alternate embodiment of the invention.
Figure 8:
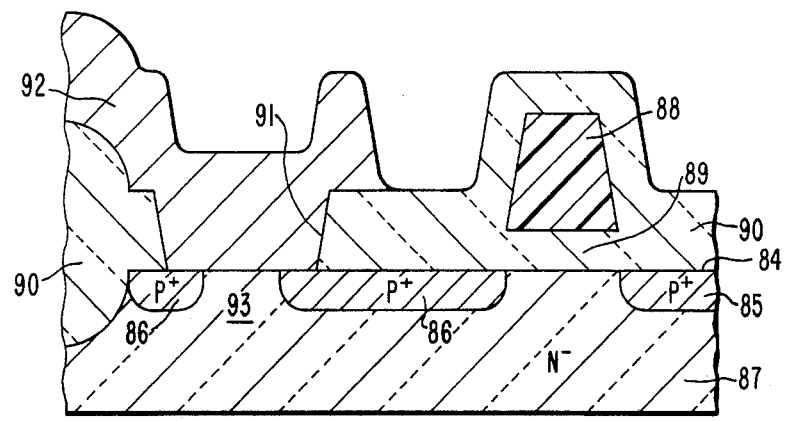
FIG. 8 is a cross-section view along the lines VIII—VIII of FIG. 7.

FIG. 7 shows P-channel transistor 84 having P+ regions 85 and 86 spaced apart in substrate 87 which may for example N−. A cross-section view along the lines VIII—VIII is shown in FIG. 8. A gate electrode 88 which may for example be made of polysilicon material is formed over gate dielectric 89. Field oxide 90 covers P+ regions 85 and 86 and has a window 91 therein exposing P+ region 86 and N− substrate 87. Metallization 92 which may be for example aluminum fills opening 91 and it makes ohmic contact with P+ region 86 and forms a Schottky barrier diode 93 with substrate 87. As shown in FIG. 7 P+ region 86 forms a guard band around Schottky barrier 93 since P+ region 86 encloses an area of substrate 87 so as to leave a portion of substrate 87 exposed on upper surface 84 interior of P+ region 86.

If substrate 87 is silicon, then aluminum may be used to form a Schottky barrier diode. Other materials such as tungsten and platinum silicide may be used.

In addition to CMOS circuitry incorporating Schottky barrier diodes, circuitry designed to protect the CMOS circuitry at external off chip connections should not include PNPN junctions subject to latch up. FIG. 9 is a schematic diagram of an input protection network 95 which may be fabricated on the chip with utilization circuitry 104 such as CMOS. An input signal external to the chip may be coupled via bonding pad 100 to line 96. Input protection network 95 functions to alternate electrostatic discharges of several thousand volts down to at least 30 volts to protect on chip circuitry.

Line 96 is coupled to the anode of Schottky diode 97, the cathode of Schottky diode 98, and to one side of resistor 99. The other side of resistor 99 is coupled over line 101 to the anode of Schottky diode 102, the cathode of Schottky diode 103 and the input of utilization circuitry 104 which may be, for example, the input of a CMOS logic gate. The cathode of Schottky diodes 97 and 102 are coupled over line 105 to voltage $V_{DD}$. The anodes of Schottky diodes 98 and 103 are coupled over line 106 to voltage $V_{SS}$. Resistor 99 may be, for example, 1K ohms which may be, for example, a polysilicon resistor deposited on an oxide.

FIG. 10 is a schematic diagram of an output protective network 108 which may be fabricated on a semiconductor chip with utilization circuitry 109. An output signal from utilization circuitry 109 is coupled over line 110 to the anode of Schottky diode 111, the cathode of Schottky diode 112, and to an off chip connection via bonding pads 114. The cathode of Schottky diode 111 is coupled over line 113 to voltage $V_{DD}$. The anode of Schottky diode 112 is coupled over line 118 to voltage $V_{SS}$.

Utilization circuitry 109 may include a P channel transistor 115 having its source and body coupled to voltage $V_{DD}$ and an N channel transistor 116 having its source and body coupled to voltage $V_{SS}$. The drain of transistors 115 and 116 are coupled together to line 110. The gate of transistors 115 and 116 are coupled together and to line 117.

Figure 11:
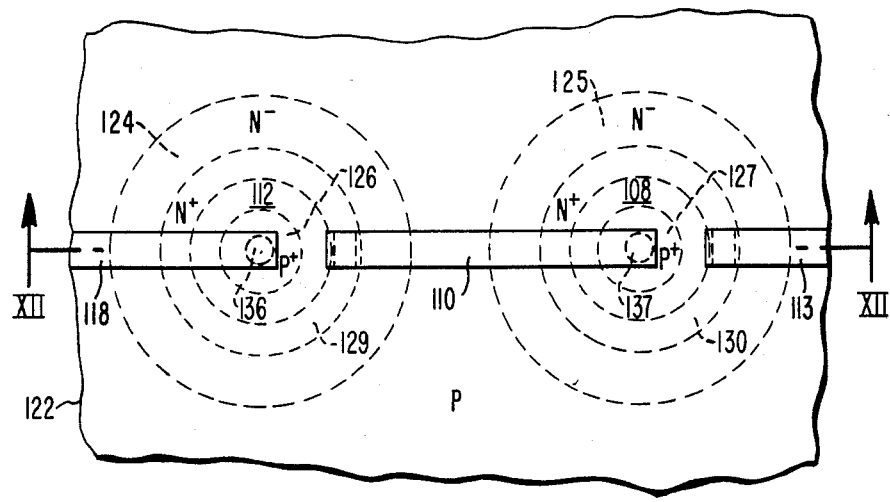
FIG. 11 is a plan view of the output protection network 108 shown in FIG. 10.
Figure 12:
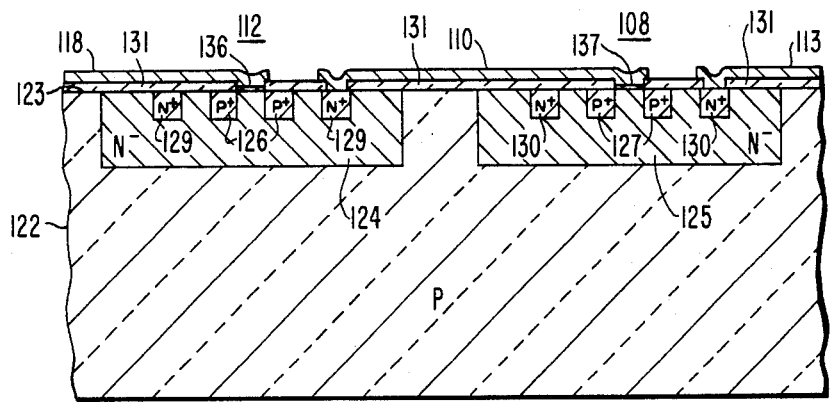
FIG. 12 is a cross section view along the lines XII—XII of FIG. 11.

FIG. 11 is a plan view of the output protection network 108 shown in FIG. 10. FIG. 12 is a cross section view along the lines XII—XII of FIG. 11. In FIGS. 10 and 11, a semiconductor substrate 122 of P-type material has an upper surface 123. N− regions 124 and 125 are formed in upper surface 123 of substrate 122. Guard rings 126 and 127 of P+ type material are formed in regions 124 and 125 respectively. Schottky barrier diode 112 is formed within guard ring 126 by the deposition of platinum which is sintered with the substrate which may by silicon to form platinum silicide 136 in contact with region 124. Schottky barrier diode 111 is formed within guard ring 127 by the deposition of platinum which is sintered with the substrate which may be silicon to form platinum silicide 137 in contact with region 125. Conductive material 118 forms a conductive path from voltage $V_{SS}$ to the platinum silicide 136, the anode of diode 112. $N_+$ regions 129 and 130 form an ohmic contact with regions 124 and 125 respectively. Conductive material 110 forms a conductive path from $N+$ region 129, the cathode of Schottky diode 112, to platinum silicide 137, the anode of Schottky diode 108. Conductive material 113 forms a conductive path from N+ region 130, the cathode of Schottky diode 108 to voltage $V_{DD}$. Conductive material 118, 110 and 113 is insulated from substrate 122 by dielectric 131 which may be, for example, silicon oxide.

The use of Schottky diodes 102 and 103 in FIG. 9 and 111 and 112 in FIG. 10 reduces the chance of latch-up compared to the use of PN junction diodes. When Schottky diodes 102, 103, 111 and 112 are forward biased, very little minority carrier current flows into the cathode, an N-type semiconductor region, for example.

In FIG. 10, Schottky diode 111 is actually in parallel with the PN junction forward biased at the drain of P channel transistor 115. Schottky diode 112 is actually in parallel with the PN junction formed at the drain of N channel transistor 116. Minority current flow across these PN junctions is limited by the fact that the Schottky diodes 111 and 112 have a lower turn-on voltage as shown in FIG. 5. The proportion of total current through the Schottky diode is five orders of magnitude greater than the current through the PN junction.

The invention describes a CMOS integrated circuit incorporating Schottky barrier diodes to prevent latch-up in PNPN structures therein arising when bulk silicon is used. The Schottky barrier diodes may be formed by the metallization system used without extra steps. The Schottky barrier diodes may be placed in parallel with the source and drain junctions to prevent minority carrier injection at times the drain or source is forward biased with respect to the substrate.

An input and an output network has been described for protecting CMOS circuits from over voltage and static electricity on off chip interconnections incorporating Schottky barrier diodes.

I claim:

1. A field effect transistor with means to attenuate the injection of minority carriers into the body at times the source is forward-biased with respect to the body comprising,
   a field effect transistor having a gate, drain, source and body, said drain and source formed by impurity regions of a first type in said body of a second type material,
   a first Schottky barrier diode formed in said body having its anode coupled to said source.

2. The field effect transistor of claim 1 further including
   a second Schottky barrier diode formed in said body having its anode coupled to said drain.

3. The field effect transistor of claim 1 wherein said material is silicon.

4. The field effect transistor of claim 3 wherein said Schottky barrier diode includes a metal silicide.

5. The field effect transistor of claim 4 wherein said metal in said metal silicide is selected from the group Au, Pt, Pd, Rh, Ni, Li, W, Ti, Zr, Ta, Cr and Mo.

6. The field effect transistor of claim 1 wherein said material is selected from the group Ge, Si, InSb, GaAs, InP, CdTe, GaP, GaTe, CdSe, SiC, ZhSe, GaSe, CdS, GaS and ZnS.

7. A field effect transistor comprising,
   a body of first type material, first and second spaced-apart regions formed in said body of second type material,
   a first metal layer extending over a portion of said first region and said body, and
   a second metal layer extending over a portion of said second region and said body,
   said first and second metal layers forming an ohmic contact with said first and second regions, respectively, and forming a Schottky barrier diode with said body,
   a layer of insulation over said body between said drain and source,
   a layer of conductive material over said layer of insulation between said drain and source to form the gate electrode.

8. The field effect transistor of claim 7 wherein said material is silicon.

9. The field effect transistor of claim 7 wherein said first metal layer extends outside the space between said first and second regions.

10. The field effect transistor of claim 7 wherein said first metal layer includes platinum.

11. The field effect transistor of claim 7 wherein said first metal layer includes aluminum.

12. A complementary MOS circuit comprising,
    a substrate of semiconductor material having first and second regions of first and second type material, respectively, in contact with each other to form a PN junction therebetween,
    at least one field effect transistor formed in said first region having a drain and source region formed of second type material and a gate electrode,
    at least one field effect transistor formed in said second region having drain and source regions formed of first type material and a gate electrode,
    a first Schottky barrier diode formed in said first region having its anode coupled to the drain of at least one field effect transistor in said first region,
    means for interconnecting at least one field effect transistor in said first region with at least one field effect transistor in said second region to form a circuit.

13. The complementary MOS circuit of claim 12 wherein said first region is said substrate and said second region is formed in the upper surface of said substrate.

14. The complementary MOS circuit of claim 13 wherein said substrate is silicon and said first Schottky barrier diode includes a metal silicide.

15. The complementary MOS circuit of claim 12 wherein said Schottky barrier diode includes platinum silicide and said substrate is silicon.

16. The complementary MOS circuit of claim 12 further including a second Schottky barrier diode formed in said first region having its anode coupled to the drain of at least one field effect transistor in said first region.

17. Apparatus for discharging currents in an integrated circuit with reduced conditions for latch up comprising:
    first and second Schottky barrier diodes, the cathode of said first diode coupled to the anode of said second diode and adapted for coupling to a first signal line for discharging currents at times said first signal line has overvoltage,
    the anode of said first Schottky diode coupled to a first potential, and the cathode of said second Schottky diode coupled to a second potential.

18. The apparatus of claim 17 further including:
    a resistor,
    a third and fourth Schottky barrier diode, said cathode of said first diode coupled through said resistor to the cathode of said third Schottky diode and the anode of said fourth Schottky diode and adapted for coupling to a second signal line for discharging currents at times said second signal line has overvoltage, the anode of said third Schottky diode coupled to said first potential and the cathode of said fourth Schottky diode coupled to said second potential.

* * * * *